(12) United States Patent
Ding et al.

(10) Patent No.: US 8,900,423 B2
(45) Date of Patent: Dec. 2, 2014

(54) LOW REFRACTIVE INDEX MATERIAL BY SPUTTERING DEPOSITION METHOD

(71) Applicant: Intermolecular, Inc., San Jose, CA (US)

(72) Inventors: Guowen Ding, San Jose, CA (US); Mohd Fadzli Anwar Hassan, San Francisco, CA (US); Minh Huu Le, San Jose, CA (US); Zhi-Wen Sun, Sunnyvale, CA (US); Yu Wang, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/715,988

(22) Filed: Dec. 14, 2012

(65) Prior Publication Data

US 2014/0170049 A1 Jun. 19, 2014

(51) Int. Cl.
| | | |
|---|---|---|
| *C23C 14/14* | (2006.01) | |
| *C23C 14/18* | (2006.01) | |
| *C23C 14/34* | (2006.01) | |
| *C01B 35/10* | (2006.01) | |
| *B05D 5/06* | (2006.01) | |
| *G02B 1/11* | (2006.01) | |

(52) U.S. Cl.
CPC ............... *B05D 5/061* (2013.01); *C23C 14/34* (2013.01); *G02B 1/113* (2013.01); *C01B 35/10* (2013.01); *C23C 14/18* (2013.01); *C23C 14/14* (2013.01)
USPC ............ 204/192.26; 204/192.27; 204/192.28; 423/278

(58) Field of Classification Search
CPC ............. H01L 2224/0345; H01L 2224/03826; H01L 2224/1145; H01L 2224/11826; H01L 2224/2745; H01L 2224/27826; H01L 2224/35826; H01L 2224/43826; H01L 21/2855; H01L 21/203; C23C 14/0036; C23C 14/0042; C23C 14/08; C23C 14/18; C23C 14/185; C23C 14/34; C23C 14/3407; C23C 14/542; C23C 14/548; G02B 1/113; C03C 17/3417; C01B 35/08; C01B 35/10; C01B 35/1027
USPC .................. 423/277, 278; 204/192.1, 192.11, 204/192.12, 192.14, 192.15, 298.01, 204/298.04, 192.26, 192.27, 192.28
See application file for complete search history.

(56) References Cited

U.S. PATENT DOCUMENTS 7,229,686 B2   6/2007   Yoshikawa et al.

OTHER PUBLICATIONS

Buc et al, "Analysis of Magnetron Sputtered Boron Oxide Films," 2007, Thin Solid Films 515, pp. 8723-8727.*
Huang et al, "Preparation and Characterization of Superhard Boron-Suboxide Films," 2003, J. Vac. Sci. Technol. A, vol. 21, No. 5 pp. 1595-1602.*

* cited by examiner

*Primary Examiner* — Stanley Silverman
*Assistant Examiner* — Justin Bova

(57) ABSTRACT

A method for forming boron oxide films formed using reactive sputtering. The boron oxide films are candidates as an anti-reflection coating. Boron oxide films with a refractive index of about 1.38 can be formed. The boron oxide films can be formed using power densities between 2 W/cm$^2$ and 11 W/cm$^2$ applied to the target. The oxygen in the reactive sputtering atmosphere can be between 40 volume % and 90 volume %.

8 Claims, 4 Drawing Sheets

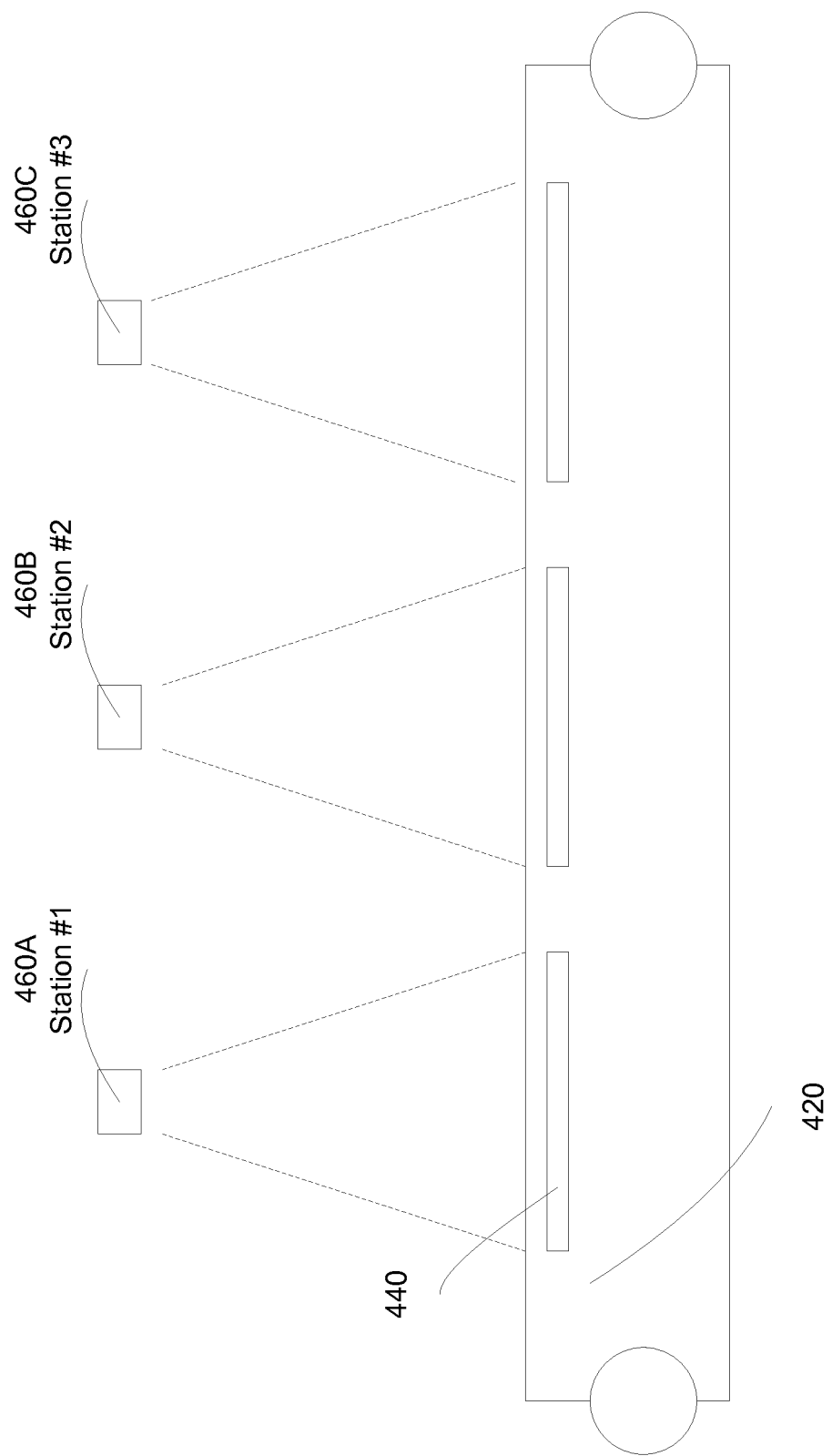

than 1.4.

LOW REFRACTIVE INDEX MATERIAL BY SPUTTERING DEPOSITION METHOD

FIELD OF THE INVENTION

The present invention relates generally to the formation of transparent materials having a low refractive index.

BACKGROUND OF THE INVENTION

Coatings that provide low reflectivity or a high percent transmission over a broad wavelength range of light are desirable in many applications including semiconductor device manufacturing, solar cell manufacturing, glass manufacturing, and energy cell manufacturing. The refractive index of a material is a measure of the speed of light in the material which is generally expressed as a ratio of the speed of light in vacuum relative to that in the material. Single layer low reflectivity coatings generally have a refractive index (n) in between air (n=1) and glass (n~1.5).

An anti-reflective (AR) coating is a type of low reflectivity coating applied to the surface of a transparent article to reduce reflectivity of visible light from the article and enhance the transmission of such light into or through the article. One method for decreasing the refractive index and enhancing the transmission of light through an AR coating is to increase the porosity of the anti-reflective coating. Porosity is a measure of the void spaces in a material. Although such anti-reflective coatings have been generally effective in providing reduced reflectivity over the visible spectrum, the coatings have suffered from deficiencies when used in certain applications. For example, porous metal oxide AR coatings which are used in solar applications are highly susceptible to moisture absorption due to their affinity for water (hydrophilicity). Moisture absorption may lead to an increase in the refractive index of the AR coating and corresponding reduction in light transmission.

Magnesium fluoride thin films can be deposited by evaporation resulting in columnar and dense films, which can be unsuitable for anti-reflective coatings, Sol-gel methods can produce magnesium fluoride thin films using colloidal crystalline $MgF_2$ nanoparticles, which can be sintered at high temperatures. Magnesium fluoride thin films can also be formed by exposing magnesium oxide to fluorine-containing vapors. These processes to form magnesium fluoride thin films can provide minimum control over the porosity level of the coated layers, resulting in limited ranges of index of refraction. However, magnesium fluoride is hard to deposit by sputtering methods.

Large scale glass coating (>1 m$^2$) requires sputtering methods for low cost and uniform deposition. Thus, there is a need for AR coatings which can be easily sputtered with high deposition rate and low refractive index with no absorbing materials.

SUMMARY OF THE DISCLOSURE

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In some embodiments, a transparent, thin film is deposited using sputtering to form an AR coating above the surface of a substrate. Reactive sputtering or reactive evaporation is used to form a boron oxide film having a refractive index of less than 1.4.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIG. 4 illustrates an in-line PVD system according to some embodiments.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

As discussed previously, there are many applications where AR coatings are used to enhance performance. The performance can be improved by developing materials with a low refractive index (n). A transparent material with a refractive index of about 1.23 would have low reflection properties. Theory predicts that the limit of the reflection of a film is proportional to $(n-1)^{3.5}$.

Magnesium fluoride films are often used as AR coatings due to a low refractive index (~1.38). However, magnesium fluoride films are difficult to produce with good control. Deposition of magnesium fluoride by sputtering is difficult because of the low conductivity of the magnesium fluoride target. Deposition of magnesium fluoride by other methods may not yield the low refractive index desired with good control.

Other materials have been investigated as a potential replacement for magnesium fluoride. As discussed previously, the material must have a low refractive index. Boron oxide is reported to have an index of refraction between 1.48 and 1.62. Boron oxide can be deposited using reactive sputtering where a conductive boron target is sputtered in an atmosphere including oxygen and argon. The deposition is performed in "poisoned mode" wherein the surface of the target is completely covered with boron oxide. The oxygen may be present in concentrations greater than 5 volume % and less than 90 volume %. Deposition rates of about 1 A/sec for each 100 W of power applied to the target can be achieved. Power densities between about 2 W/cm$^2$ and about 11 W/cm$^2$ can be applied to the target. As an example, a 3-inch diameter (7.62 cm) target can be used and powers between 100 W (~2 W/cm$^2$) and 500 W (~11 W/cm$^2$) can be used for the deposition.

Figure 1:
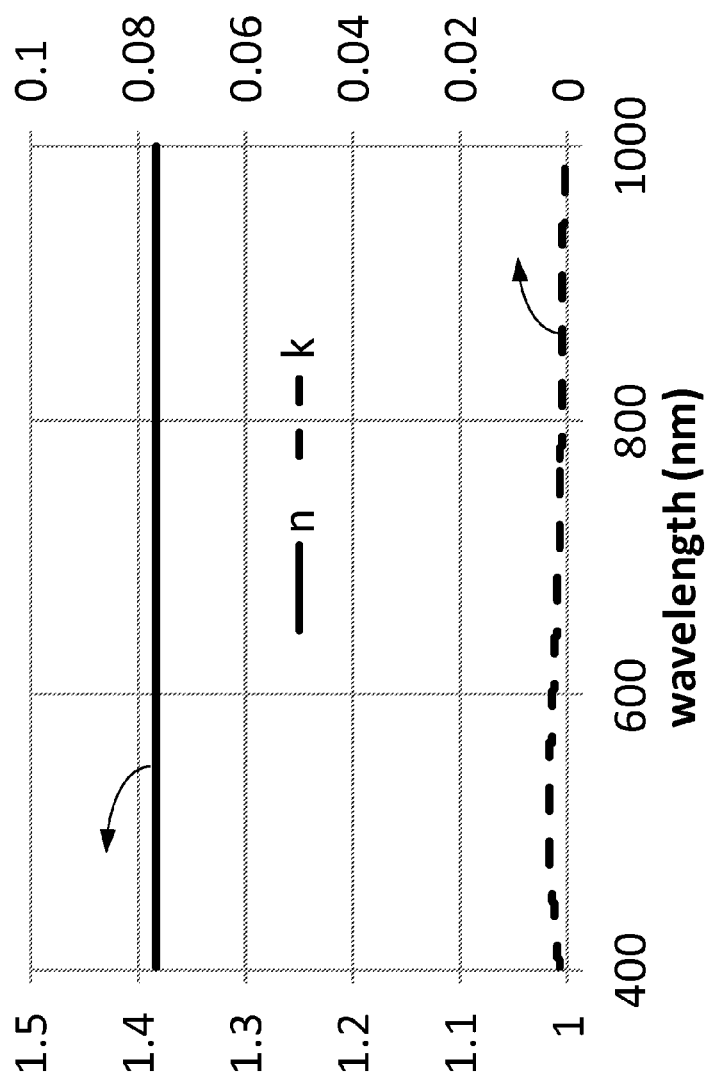
FIG. 1 presents data for the refractive index (n) and extinction coefficient (k) as a function of wavelength for the boron oxide films after deposition according to some embodiments.

FIG. 1 presents data for the refractive index (n) and extinction coefficient (k) as a function of wavelength for the boron oxide films after deposition according to some embodiments. The refractive index (n) is about 1.38 and is constant across the visible spectrum. Additionally, the extinction coefficient is almost zero, meaning that the film does not absorb the light strongly. The data were collected for a 100 nm film, sputter deposited from a 3-inch boron target, using 180 W of power (e.g. power density of about 3.9 W/cm$^2$), an Ar gas flow of 3 slpm and an O$_2$ flow of 17 slpm. The power density on the target was investigated in the range between 2 W/cm$^2$ and 11 W/cm$^2$.

Figure 2:
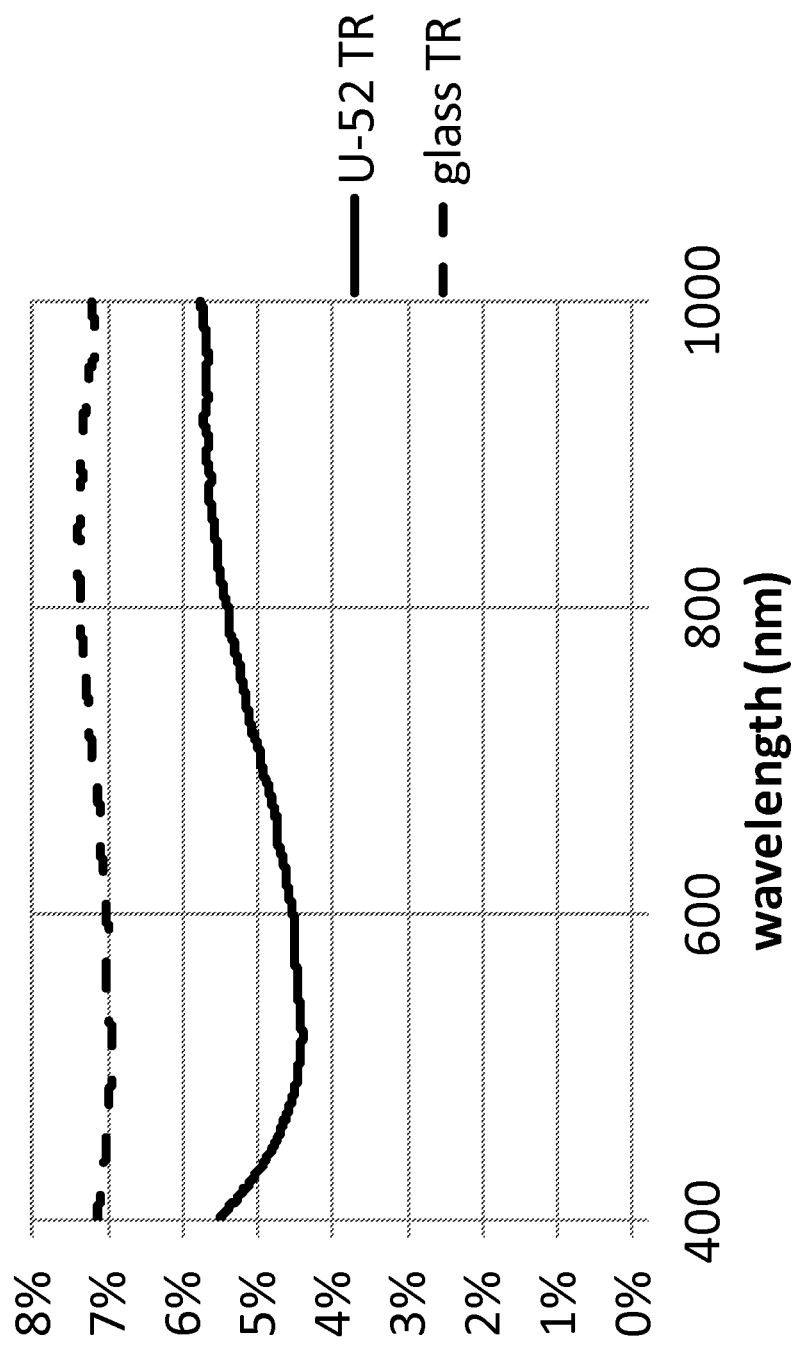
FIG. 2 presents data for the total reflection as a function of wavelength for a glass substrate and a substrate coated with a 107 nm boron oxide AR film according to some embodiments.

FIG. 2 presents data for the total reflection as a function of wavelength for a glass substrate and a substrate coated with a 107 nm AR film according to some embodiments. The total reflection of an uncoated glass substrate is about 7% and is approximately constant for wavelengths between 400 nm and 1000 nm. A 107 nm thick boron oxide film sputter deposited from a 3-inch diameter boron target, using 180 W of power (e.g. power density of about 3.9 W/cm$^2$), an Ar gas flow of 3 slpm and an O$_2$ flow of 17 slpm was formed on the glass substrate. The power density on the target was investigated in the range between 2 W/cm$^2$ and 11 W/cm$^2$. The data in FIG. 2 indicate that the total reflection can be reduced to less than 6% for wavelengths between 400 nm and 1000 nm and to less than 5% for wavelengths between about 400 nm and about 700 nm.

Figure 3A:
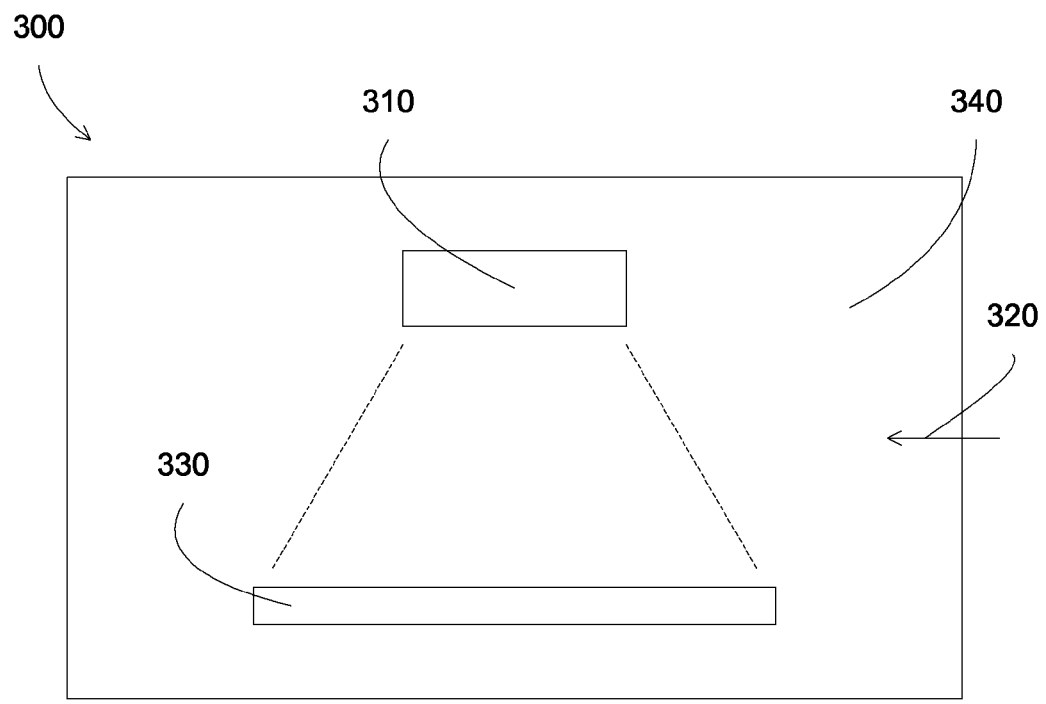
FIGS. 3A and 3B illustrate a PVD system according to some embodiments.
Figure 3B:
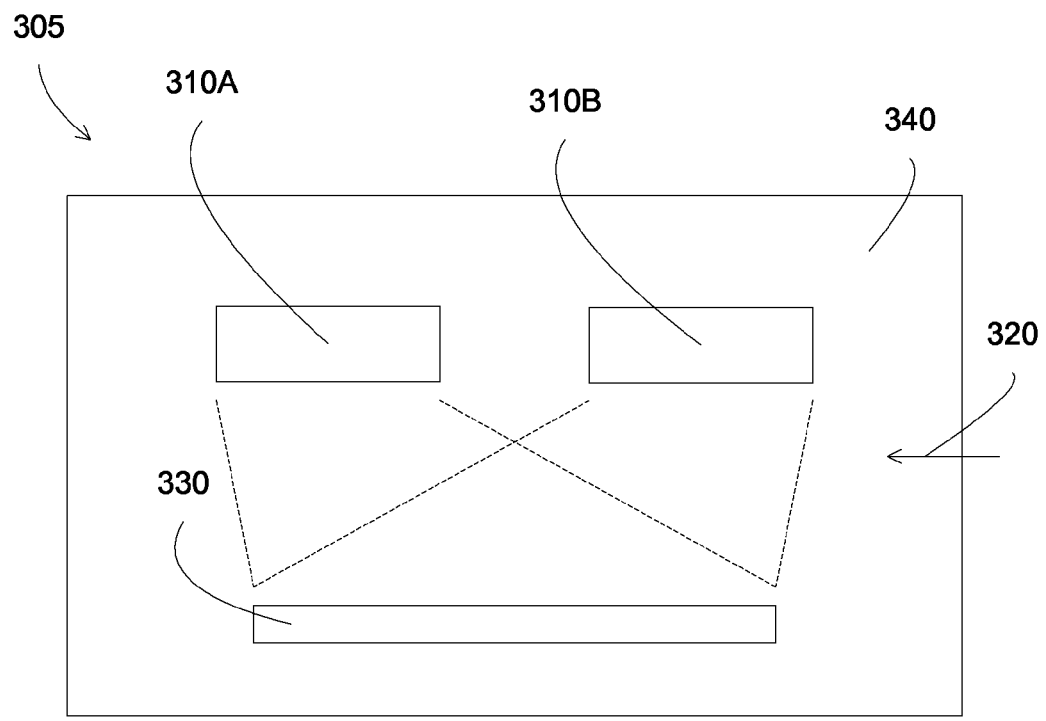

FIGS. 3A and 3B illustrate exemplary physical vapor deposition (PVD) systems according to some embodiments. In FIG. 3A, the PVD system, also commonly called sputter system or sputter deposition system, 300, includes a housing that defines, or encloses, a processing chamber, 340, a substrate, 330, a target assembly, 310, and reactive species delivered from an outside source, 320. The substrate can be stationary, or in some manufacturing environments, the substrate may be in motion during the deposition processes. During deposition, the target is bombarded with argon ions, which releases sputtered particles toward the substrate, 330. The sputter system, 300, can perform blanket deposition on the substrate, 330, forming a deposited layer that covers the whole substrate, (e.g., the area of the substrate that can be reached by the sputtered particles generated from the target assembly, 310). A reactive gas such as oxygen or nitrogen may be added to the sputtering atmosphere to form metal compounds such as metal oxide, metal nitride, or metal oxy-nitride layers on the substrate. As discussed previously, a boron target and oxygen can be used to deposit a boron oxide AR film.

In FIG. 3B, a sputter deposition chamber, 305, comprises two target assemblies, 310A and 310B, disposed in the processing chamber, 340, containing reactive species delivered from an outside source, 320. The target assemblies, 310A and 310B, can comprise different materials to deposit an alloy or multi-component layer on substrate, 330. This configuration is exemplary, and other sputter system configurations can be used, such as a single target as above. As discussed previously, reactive gases can be used to form metal compound layers.

The materials used in the target assembly, 310 (FIG. 3A), may, for example, include aluminum, boron, silicon, tin, titanium, or any combination thereof (i.e., a single target may be made of an alloy of several metals). Additionally, the materials used in the targets may include oxygen, nitrogen, or a combination of oxygen and nitrogen in order to form the oxides, nitrides, and oxynitrides described above. Additionally, although only one target assembly, 310, is shown (FIG. 3A), additional target assemblies may be used (e.g. FIG. 3B). As such, different combinations of targets may be used to form the different layers described above.

The sputter deposition system, 300, can comprise other components, such as a substrate support for supporting the substrate. The substrate support can comprise a vacuum chuck, electrostatic chuck, or other known mechanisms. The substrate support can be capable of rotating around an axis thereof that is perpendicular to the surface of the substrate. In addition, the substrate support may move in a vertical direction or in a planar direction. It should be appreciated that the rotation and movement in the vertical direction or planar direction may be achieved through known drive mechanisms which include magnetic drives, linear drives, worm screws, lead screws, a differentially pumped rotary feed through drive, etc.

In some embodiments, the substrate support includes an electrode which is connected to a power supply, for example, to provide a RF or dc bias to the substrate, or to provide a plasma environment in the process housing, 340. The target assembly, 310, can include an electrode which is connected to a power supply to generate a plasma in the process housing. The target assembly, 310, is preferably oriented towards the substrate, 330.

The sputter deposition system, 300, can also comprise a power supply coupled to the target electrode. The power supply provides power to the electrodes, causing material to be sputtered from the target. During sputtering, inert gases, such as argon or krypton, may be introduced into the processing chamber, 340, through the gas inlet, 320. In some embodiments in which reactive sputtering is used, reactive gases may also be introduced, such as oxygen and/or nitrogen, which interact with particles ejected from the targets to form oxides, nitrides, and/or oxy-nitrides on the substrate as described above.

The sputter deposition system, 300, can also comprise a control system (not shown) having, for example, a processor and a memory, which is in operable communication with the other components and configured to control the operation thereof in order to perform the methods described herein.

FIG. 4 illustrates an exemplary in-line deposition (e.g. sputtering) system that might be used to deposit coating on large area substrates according to some embodiments. FIG. 4 illustrates a system with three deposition stations, but those skilled in the art will understand that any number of deposition stations can be supplied in the system. For example, the three deposition stations illustrated in FIG. 4 can be repeated and provide systems with 6, 9, 12, etc. targets, limited only by the desired layer deposition sequence and the throughput of the system. A transport mechanism, 420, such as a conveyor belt or a plurality of rollers, can transfer substrate, 440, between different deposition stations. For example, the substrate can be positioned at station #1, comprising a target assembly, 460A, then transferred to station #2, comprising target assembly, 460B, and then transferred to station #3, comprising target assembly, 460C. Station #1 can be configured to deposit a first layer. Station #2 can be configured to deposit a second layer with the same or different composition. Station #3 can be configured to deposit a third layer with the same or different composition.

Although only a single target is illustrated in each deposition station of FIG. 4, in some embodiments, a deposition station may include more than one target to allow the co-sputtering of more than one material as discussed previously. As discussed previously, each deposition station may have the ability to also use reactive gases to deposit metal compound layers.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming a boron oxide film stack comprising:
   providing a substrate, wherein the substrate comprises glass; and
   depositing a layer above the substrate using reactive sputtering, wherein the reactive sputtering comprises sputtering material from a target while a power of about 3.9 W/cm$^2$ is applied to the target, and wherein the layer is operable as an anti-reflection coating has a thickness of 107 nanometers (nm), comprises boron oxide, and has a refractive index of less than 1.4.

2. The method of claim 1 wherein the layer is deposited using a conductive boron target.

3. The method of claim 1 wherein the reactive sputtering occurs in a gaseous environment comprising 15 volume % argon and 85 volume % oxygen.

4. The method of claim 1 wherein the refractive index of the layer is about 1.38.

5. The method of claim 3 wherein a flow rate of the argon in the gaseous environment is 3 slpm and a flow rate of the oxygen in the gaseous environment is 17 slpm.

6. A method for forming a boron oxide film stack comprising:
   providing a substrate; and
   depositing a boron oxide-containing layer above the substrate using reactive sputtering, wherein the reactive sputtering comprises sputtering material from a boron target while a power of about 3.9 W/cm$^2$ is applied to the boron target, and wherein the boron oxide-containing layer has a thickness of 107 nanometers and a refractive index of less than 1.4.

7. The method of claim 6 wherein the reactive sputtering occurs in a gaseous environment comprising comprising 15 volume % argon and 85 volume % oxygen.

8. The method of claim 7 wherein the refractive index of the boron oxide-containing layer is about 1.38.

* * * * *